US012411003B2

(12) United States Patent
Lee et al.

(10) Patent No.: US 12,411,003 B2
(45) Date of Patent: Sep. 9, 2025

(54) APPARATUS FOR WAFER PLACEMENT TEACHING AND METHOD FOR WAFER PLACEMENT TEACHING USING THE SAME

(71) Applicant: SEMES CO., LTD., Cheonan-si (KR)

(72) Inventors: Chung Woo Lee, Suwon-si (KR); Tae Dong Park, Hwaseong-si (KR); Chang Jun Park, Pyeongtaek-si (KR); Jin Hwan Kim, Hwaseong-si (KR)

(73) Assignee: SEMES CO., LTD., Cheonan-si (KR)

(*) Notice: Subject to any disclaimer, the term of this patent is extended or adjusted under 35 U.S.C. 154(b) by 133 days.

(21) Appl. No.: 18/082,572

(22) Filed: Dec. 15, 2022

(65) Prior Publication Data

US 2023/0194239 A1 Jun. 22, 2023

(30) Foreign Application Priority Data

Dec. 17, 2021 (KR) ........................ 10-2021-0181570

(51) Int. Cl.
*G01B 11/00* (2006.01)
*G01B 11/14* (2006.01)
(Continued)

(52) U.S. Cl.
CPC ............ *G01B 11/002* (2013.01); *G01B 11/14* (2013.01); *H01L 21/67259* (2013.01); *H01L 21/6831* (2013.01)

(58) Field of Classification Search
CPC ....... G01B 11/002; G01B 11/14; G01B 11/02; H01L 21/67259; H01L 21/6831;
(Continued)

(56) References Cited

U.S. PATENT DOCUMENTS 9,405,287 B1 8/2016 Ravid et al.
10,777,435 B2 9/2020 Matsuura
(Continued)

FOREIGN PATENT DOCUMENTS

CN 113412534 9/2021
CN 113752399 12/2021
(Continued)

OTHER PUBLICATIONS

Office Action from the Japan Patent Office dated Dec. 12, 2023.
(Continued)

*Primary Examiner* — Jonathan M Hansen

(57) ABSTRACT

Proposed are a wafer position detection apparatus and a wafer position detection and correction method using the same. More specifically, proposed is an apparatus for wafer placement teaching for adjusting a position of a wafer disposed on an electrostatic chuck, the apparatus including a laser distance sensor disposed above the electrostatic chuck, and a controller configured to control a robot configured to transfer the wafer. The controller checks a relative position of the electrostatic chuck and the wafer disposed on the electrostatic chuck using the laser distance sensor so that the wafer is transferred to a predetermined position, and teaches the position of the wafer using the checked relative position of the electrostatic chuck and the wafer.

20 Claims, 5 Drawing Sheets

(51) Int. Cl.
  *H01L 21/67* (2006.01)
  *H01L 21/683* (2006.01)
(58) Field of Classification Search
  CPC ....... H01L 21/67; H01L 21/677; H01L 21/68; H01L 21/681; H01L 21/683; H01L 21/6833; H01L 21/68721; H01L 21/67742; H01L 21/68707
  See application file for complete search history.

(56) References Cited

U.S. PATENT DOCUMENTS

| | | | | |
|---|---|---|---|---|
| 11,819,950 | B2* | 11/2023 | Komatsu | B23K 26/0823 |
| 2019/0325601 | A1* | 10/2019 | Chen | B25J 9/1697 |
| 2021/0379703 | A1 | 12/2021 | Komatsu | |
| 2022/0126454 | A1* | 4/2022 | Martin | H01J 37/32733 |

FOREIGN PATENT DOCUMENTS

| | | |
|---|---|---|
| JP | 2018-206992 | 12/2018 |
| JP | 2021-048270 | 3/2021 |
| KR | 10-2013-0058413 | 6/2013 |
| KR | 10-2017-0039461 | 4/2017 |
| KR | 10-2018-0033447 | 4/2018 |
| KR | 10-2018-0109300 | 10/2018 |
| KR | 10-2021-0151683 | 12/2021 |

OTHER PUBLICATIONS

Office Action from the Korean Intellectual Property Office dated Dec. 5, 2023.
Office Action from the China National Intellectual Property Administration dated Jul. 18, 2025.

* cited by examiner

APPARATUS FOR WAFER PLACEMENT TEACHING AND METHOD FOR WAFER PLACEMENT TEACHING USING THE SAME

CROSS REFERENCE TO RELATED APPLICATION

The present application claims priority to Korean Patent Application No. 10-2021-0181570, filed Dec. 17, 2021, the entire contents of which is incorporated by reference herein for all purposes.

BACKGROUND OF THE INVENTION

Field of the Invention

The present disclosure relates to a wafer position detection apparatus and a wafer position detection and correction method using the same.

Description of the Related Art

In the manufacture of a semiconductor device or a liquid crystal display, various processes such as a photolithography process, an etching process, an ion implantation process, a deposition process, a cleaning process, etc. are performed on a wafer.

Among such processes, the etching process is performed on an electrostatic chuck (ESC) located within an etching chamber. In order to precisely perform the above-described process, it is required that a wafer be accurately placed at a predetermined position on the electrostatic chuck. This operation of placing the wafer at the predetermined position on the electrostatic chuck is called a teaching operation.

Various methods for precise teaching operation have been proposed. For example, Korean Patent Application Publication No. 10-2018-0109300 discloses a method in which a light receiving area is provided on an electrostatic chuck and a light receiving member receives light reflected from the light receiving area to teach the position of a wafer.

Furthermore, a method for teaching the wafer position using a vision system has been proposed.

However, most methods proposed so far are cases in which the electrostatic chuck has a larger area than the wafer, and thus are difficult to apply when the wafer has a larger area than the electrostatic chuck and thus covers the electrostatic chuck.

The foregoing is intended merely to aid in the understanding of the background of the present disclosure, and is not intended to mean that the present disclosure falls within the purview of the related art that is already known to those skilled in the art.

SUMMARY OF THE INVENTION

Accordingly, the present disclosure has been made keeping in mind the above problems occurring in the related art, and an objective of the present disclosure is to provide an apparatus for wafer placement teaching, the apparatus being capable of accurately teaching the position of a wafer even when the wafer has a larger area than an electrostatic chuck, and to provide a method for wafer placement teaching using the same apparatus.

In order to achieve the above objective, according to one aspect of the present disclosure, there is provided an apparatus for wafer placement teaching for adjusting a position of a wafer disposed on an electrostatic chuck, the apparatus including: a laser distance sensor disposed above the electrostatic chuck; and a controller configured to control a robot configured to transfer the wafer, wherein the controller may check a relative position of the electrostatic chuck and the wafer disposed on the electrostatic chuck using the laser distance sensor so that the wafer is transferred to a predetermined position, and teaches the position of the wafer using the checked relative position of the electrostatic chuck and the wafer.

At least three laser distance sensors may be installed, wherein each of the laser distance sensors may measure a distance from a first point that is any one point located inside the electrostatic chuck among points on a first straight line that is an imaginary straight line passing through a center of the electrostatic chuck to an edge of the electrostatic chuck located on the first straight line, measure a distance from the first point on the first straight line to an edge of the wafer in a state in which the wafer is disposed on the electrostatic chuck, calculate a distance difference between the distance from the first point to the edge of the electrostatic chuck and the distance from the first point to the edge of the wafer, and compare the distance difference measured by each of the laser distance sensors to teach the position of the wafer.

The distance from the first point on the first straight line to the edge of the electrostatic chuck may be obtained by repeatedly measuring a distance from each point on a line segment extending from the first point to a second point, which is a point on the first straight line and is outside the electrostatic chuck, to each of the laser distance sensors.

The distance from the first point on the first straight line to the edge of the wafer may be obtained by repeatedly measuring a distance from each point on a line segment extending from the first point to a third point, which is a point on the first straight line and is outside the wafer, to each of the laser distance sensors.

The laser distance sensor may be configured in the form of a module in which a plurality of distance sensors are combined.

At least three laser distance sensors may be installed, wherein each of the laser distance sensors may check coordinates of an edge of the electrostatic chuck by measuring a distance from a first point that is any one point located inside the electrostatic chuck among points on a first straight line that is an imaginary straight line passing through a center of the electrostatic chuck to the edge of the electrostatic chuck located on the first straight line, check coordinates of an edge of the wafer by measuring a distance from the first point on the first straight line to the edge of the wafer, and calculate respective coordinates of centers of the electrostatic chuck and the wafer using the coordinates checked by each of the laser distance sensors and then compares the coordinates to teach the position of the wafer.

According to another aspect of the present disclosure, there is provided a method for wafer placement teaching for adjusting a position of a wafer disposed on an electrostatic chuck, the method including: a first measurement step of measuring a position of the electrostatic chuck using a laser distance sensor; a second measurement step of measuring the position of the wafer disposed on the electrostatic chuck using the laser distance sensor; and a step of teaching the position of the wafer using the position of the electrostatic chuck measured in the first measurement step and the position of the wafer measured in the second measurement step.

The first measurement step may be performed by measuring a distance from a first point that is any one point located inside the electrostatic chuck among points on a first straight line that is an imaginary straight line passing through a center of the electrostatic chuck to an edge of the electrostatic chuck located on the first straight line, the second measurement step may be performed by measuring a distance from the first point on the first straight line to an edge of the wafer in a state in which the wafer is disposed on the electrostatic chuck, and the position of the wafer may be taught using a distance difference between the distance from the first point to the edge of the electrostatic chuck and the distance from the first point to the edge of the wafer.

The first measurement step may be performed by repeatedly measuring a distance from each point on a line segment extending from the first point to a second point, which is a point on the first straight line and is outside the electrostatic chuck, to the laser distance sensor.

The second measurement step may be performed by repeatedly measuring a distance from each point on a line segment extending from the first point to a third point, which is a point on the first straight line and is outside the wafer, to the laser distance sensor.

The laser distance sensor may be configured in the form of a module in which a plurality of distance sensors are combined.

According to the present disclosure, it is possible to provide an apparatus for wafer placement teaching, the apparatus being capable of accurately teaching the position of a wafer even when the wafer has a larger area than an electrostatic chuck, and to provide a method for wafer placement teaching using the same apparatus.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Hereinafter, specific contents of the present disclosure will be described in detail in conjunction with exemplary embodiments of the present disclosure. All terms or words used in the specification and claims have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Further, when describing the elements of the present disclosure, terms such as first, second, A, B, (a), or (b) may be used. Each of these terms is not used to define essence, order, sequence, or number of an element, but is used merely to distinguish the corresponding element from another element.

First, an embodiment of an apparatus for wafer placement teaching, which is the first form of the present disclosure, will be described with reference to the accompanying drawings.

Figure 1:
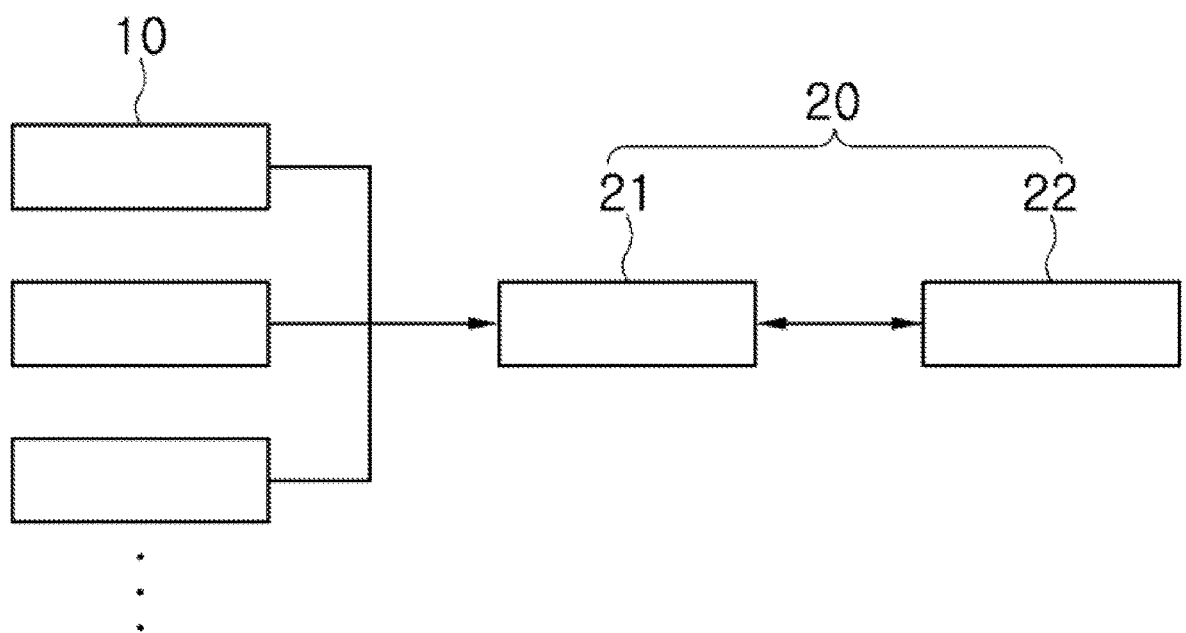
FIG. 1 is a block diagram illustrating an apparatus for wafer placement teaching according to an embodiment of the present disclosure.
Figure 2:
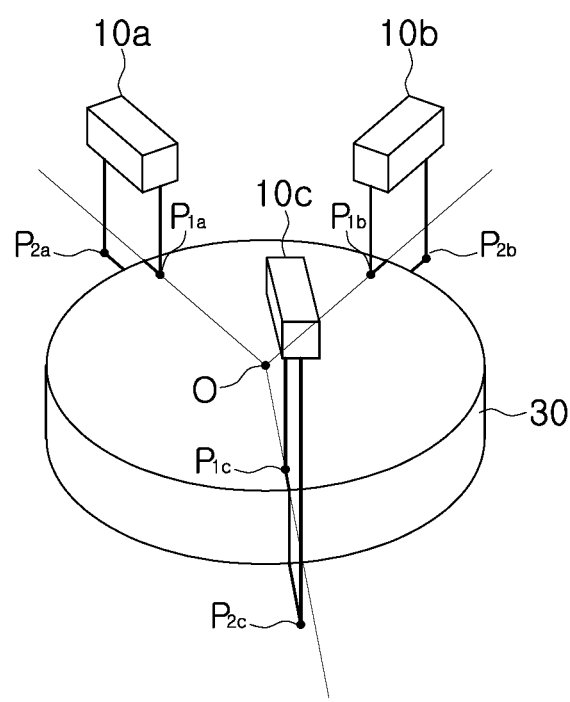
FIG. 2 is a view illustrating a relationship between an electrostatic chuck and a laser distance sensor.
Figure 3:
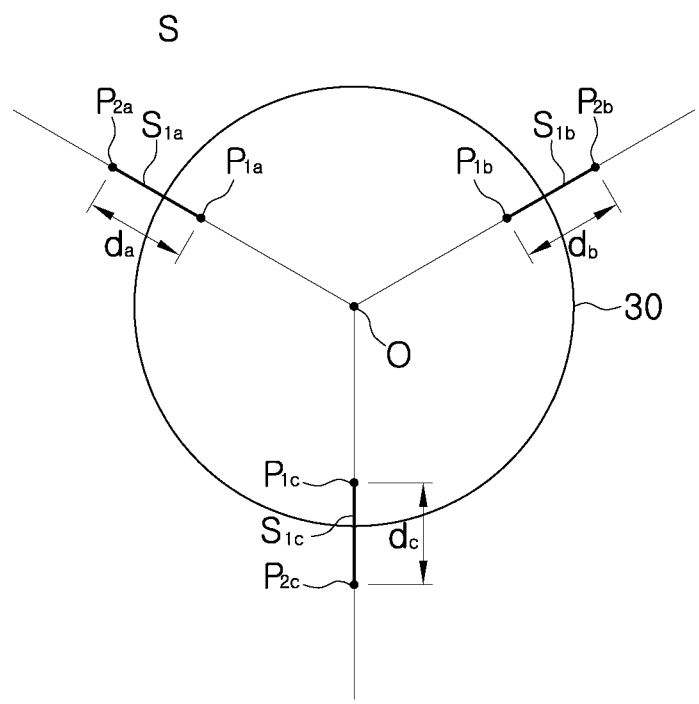
FIGS. 3 and 4 are views illustrating measuring the distance from a first point to the edge of the electrostatic chuck using the laser distance sensor.
Figure 4:
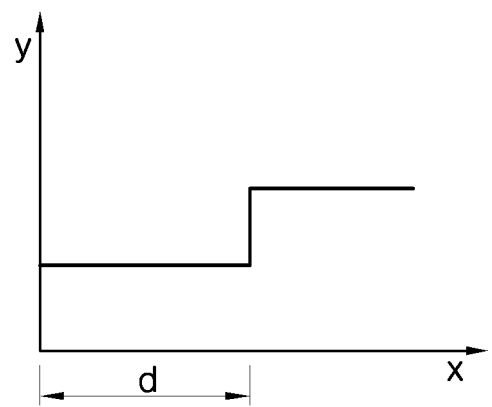
Figure 5:
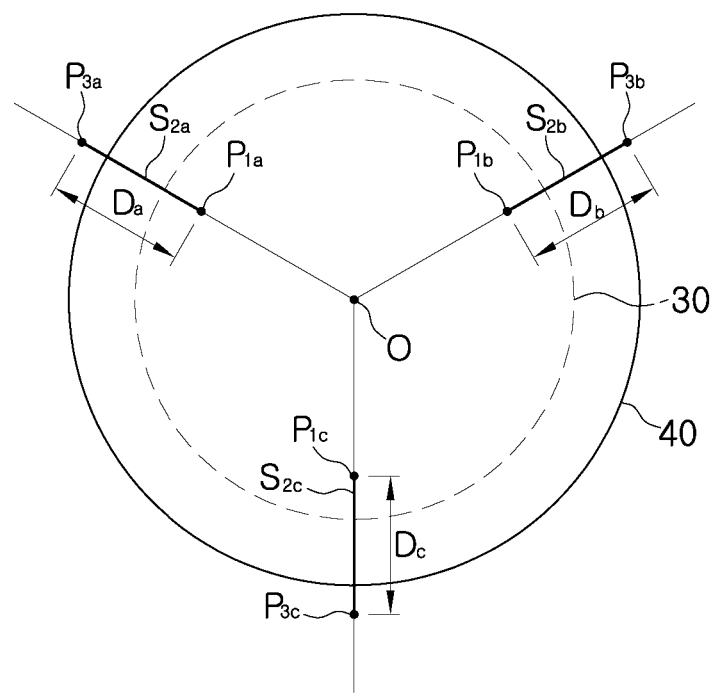
FIGS. 5 and 6 are views illustrating measuring the distance from the first point to the edge of a wafer using the laser distance sensor.
Figure 6:
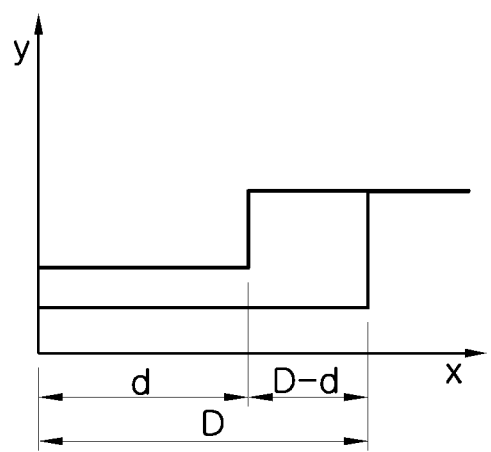
Figure 7:
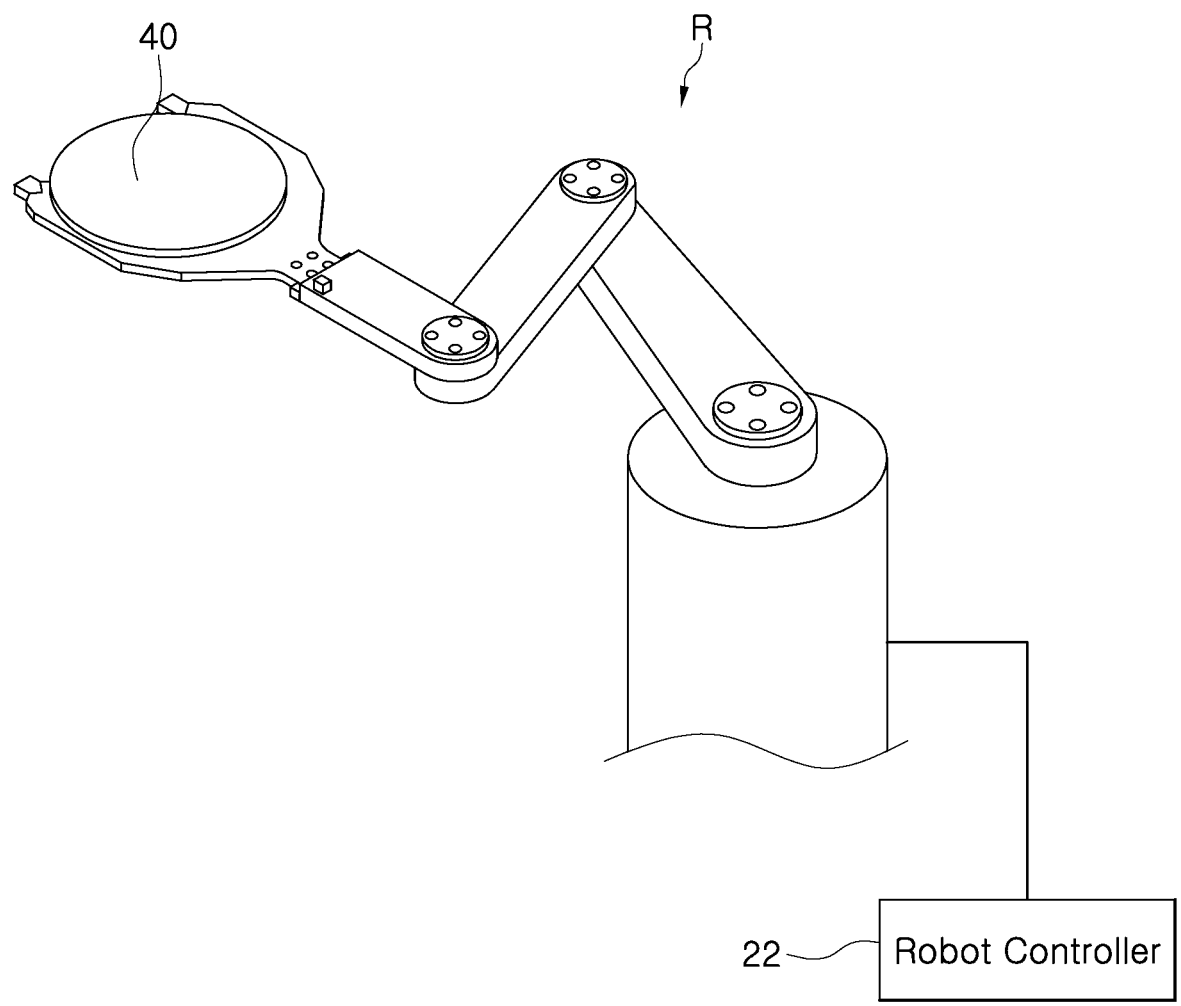
FIG. 7 is a view illustrating a robot that transfers the wafer.

FIG. 1 is a block diagram illustrating the apparatus for wafer placement teaching according to an embodiment of the present disclosure. FIG. 2 is a view illustrating a relationship between an electrostatic chuck 30 and a laser distance sensor 10. FIGS. 3 and 4 are views illustrating measuring the distance from a first point to the edge of the electrostatic chuck 30 using the laser distance sensor 10. FIGS. 5 and 6 are views illustrating measuring the distance from the first point to the edge of a wafer 40 using the laser distance sensor 10. FIG. 7 is a view illustrating a robot R that transfers the wafer.

The apparatus for wafer placement teaching according to the present embodiment is an apparatus for adjusting the position of the wafer 40 disposed on the electrostatic chuck 30 and includes the laser distance sensor 10 and a controller 20.

The laser distance sensor 10 (i.e., a laser distance meter) is a sensor that measures the distance between two points using a laser. In this embodiment, the laser distance sensor 10 is in the form of a module in which a plurality of laser distance sensors are combined and is configured to measure the distances between a plurality of points simultaneously. In an embodiment, the laser distance sensor 10 may be based on the principle of reflection of a laser beam. To measure a distance, the laser distance sensor 10 may emit a pulse of laser in the direction of an object. The time necessary for the laser beam to get to the object and go back determines the measurement of the distance to the object.

At least three laser distance sensors 10 are installed. In this embodiment, three laser distance sensors 10 are installed as illustrated in FIG. 2. The reason why the at least three laser distance sensors 10 are required is that when there is information on the coordinates of at least three points, one circle passing through the three points is determined.

The controller 20 is configured to control the position of the wafer 40 disposed on the electrostatic chuck 30. In this embodiment, the controller 20 includes a distance sensor controller 21 and a robot controller 22.

The distance sensor controller 21 checks a relative position of the electrostatic chuck 30 and the wafer 40 disposed on the electrostatic chuck 30 using the laser distance sensors 10, checks whether the wafer 40 is disposed at a predetermined position using the checked relative position, and moves the position of the wafer 40 to the predetermined position using the robot controller 22 when the wafer 40 is disposed at a position other than the predetermined position.

As illustrated in FIG. 7, the robot controller 22 controls the robot R that transfers the wafer 40.

Hereinafter, an embodiment of a method of teaching the position of a wafer 40 using the above-described configuration will be described.

The basic principle of wafer placement teaching is to arrange the wafer 40 at a position where an electrostatic chuck 30 and the wafer 40 are concentric with each other. To this end, two embodiments are proposed. A first embodiment is a method of checking whether an electrostatic chuck 30 and a wafer 40 are concentric by measuring the distances from a specific point (a first point) on the electrostatic chuck 30 to the edge of the electrostatic chuck 30 and the edge of the wafer and then comparing a difference between the distances. A second embodiment is a method of obtaining the coordinates of the center of a wafer 40 using the measured distances from a specific point (a first point) on an electrostatic chuck 30 to the edge of the electrostatic chuck 30 and the edge of the wafer 40 and then checking whether the center of the wafer 40 coincides with the center of the electrostatic chuck 30.

Before describing the method of teaching the position of the wafer 40, some terms that will be used in the description will be defined.

A first straight line l is an arbitrary straight line that passes through the center O of the electrostatic chuck 30. As illustrated in FIGS. 3 and 5, three first straight lines $l_a$, $l_b$, and $l_c$ are used for teaching the position of the wafer 40.

The first point $P_1$ is a point located inside the electrostatic chuck 30 among points on the first straight line l. The first point $P_1$ is also defined as three points $P_{1a}$, $P_{1b}$, and $P_{1c}$. The distances between the three first points $P_{1a}$, $P_{1b}$, and $P_{1c}$ and the center O of the electrostatic chuck 30 may be the same or different.

A second point $P_2$ is a point located outside the electrostatic chuck 30 among the points on the first straight line l. The second point $P_2$ is also defined as three points $P_{2a}$, $P_{2b}$, and $P_{2c}$. The distances between the three second points $P_{2a}$, $P_{2b}$, and $P_{2c}$ and the center O of the electrostatic chuck 30 may also be the same or different.

A third point $P_3$ is a point located outside the wafer 40 among the points on the first straight line l. The third point $P_3$ is also defined as three points $P_{3a}$, $P_{3b}$, and $P_{3c}$. The distances between the three third points $P_{3a}$, $P_{3b}$, and $P_{3c}$ and the center O of the electrostatic chuck 30 may also be the same or different.

A first line segment $S_1$ is a line segment that connects the first point $P_1$ and the second point $P_2$. Since the first point $P_1$ and the second point $P_2$ are each defined as three points, the first line segment $S_1$ is also defined as three line segments $S_{1a}$, $S_{1b}$, and $S_{1c}$.

A first line segment $S_2$ is a line segment that connects the first point $P_1$ and the third point $P_3$. Since the first point $P_1$ and the third point $P_3$ are each defined as three points, the second line segment $S_2$ is also defined as three line segments $S_{2a}$, $S_{2b}$, and $S_{2c}$.

The reason why the number of each of the above-described first straight line l, first point $P_1$, second point $P_2$, third point $P_3$, first line segment $S_1$, and second line segment $S_2$ is defined as three is because three laser distance sensors are used in this embodiment. When the number of the laser distance sensors is increased, the number of each of the above-described first straight line l, first point $P_1$, second point $P_2$, third point $P_3$, first line segment $S_1$, and second line segment $S_2$ is required to be also increased by the same number as the number of the laser distance sensors.

The method of teaching the position of the wafer 40 includes a first measurement step and a second measurement step. The position of the wafer 40 is taught by determining whether the wafer 40 is at a predetermined position using a relative position of the electrostatic chuck 30 and the wafer 40 measured in the first measurement step and the second measurement step.

The first measurement step is a step of measuring the position of the electrostatic chuck 30 using a laser distance sensor 10. The second measurement step is a step of measuring the position of the wafer 40 disposed on the electrostatic chuck 30 using the laser distance sensor 10. Since the position of the electrostatic chuck 30 does not change, when the position of the electrostatic chuck 30 is measured by performing the first measurement step one time, it is not necessary to perform the measurement every time the wafer 40 enters a process chamber. However, when it is necessary to periodically check the position of the electrostatic chuck 30, the first measurement step may be performed.

In the first measurement step, as illustrated in FIG. 3, the distance from the first point $P_1$ on the first straight line l to the edge of the electrostatic chuck 30 is measured. This is made by a method of repeatedly measuring the distance from the laser distance sensor 10 to each point on the first line segment $S_1$ using the laser distance sensor 10. FIG. 4 is a graph illustrating a measurement result obtained by the laser distance sensor 10. The x-axis is the distance from the first point $P_1$ to a measurement point, and the y-axis is the distance between the laser distance sensor 10 and a measurement point on the first line segment $S_1$. As illustrated in the graph of FIG. 4, the distance between the laser distance sensor 10 and the measurement point on the first line segment $S_1$ is increased at the point corresponding to the edge of the electrostatic chuck 30. With this graph, it is possible to determine the edge of the electrostatic chuck 30 and calculate the distance d from the first point $P_1$ to the edge of the electrostatic chuck 30.

The first measurement step is performed through three laser distance sensors $10_a$, $10_b$, and $10_c$, so that the distances $d_a$, $d_b$, and $d_c$ between the first points $P_{1a}$, $P_{1b}$, and $P_{1c}$ and the edge of the electrostatic chuck 30 are calculated by the laser distance sensors $10_a$, $10_b$, and $10_c$, respectively.

In the second measurement step, as illustrated in FIG. 5, the distance from the first point $P_1$ on the first straight line l to the edge of the wafer 40 is measured. FIG. 6 is a graph illustrating a measurement result obtained by the laser distance sensor 10, in which the measurement result for the electrostatic chuck 30 is also illustrated for reference.

The second measurement step is performed through the three laser distance sensors $10_a$, $10_b$, and $10_c$, so that the distances $D_a$, $D_b$, and $D_c$ between the first points $P_{1a}$, $P_{1b}$, and $P_{1c}$ and the edge of the wafer 40 are calculated by the laser distance sensors $10a$, $10b$, and $10c$, respectively. Since the second measurement step uses the same mechanism as the first measurement step, a detailed description thereof will be omitted.

The laser distance sensor 10 is configured in the form of a module in which a plurality of laser distance sensors are combined, so that the respective distances from the laser distance sensor 10 to each point on the two line segments $S_1$ and $S_2$ are measured simultaneously.

When the distances $d_a$, $d_b$, and $d_c$ from the first points $P_{1a}$, $P_{1b}$, and $P_{1c}$ to the edge of the electrostatic chuck 30 and the distances $D_a$, $D_b$, and $D_c$ from the first points $P_{1a}$, $P_{1b}$, and $P_{1c}$ to the edge of the wafer 40 are measured through the first and second measurement steps, distance differences $D_a-d_a$, $D_b-d_b$, and $D_c-d_c$ are calculated. When the differences are the same, it is determined that the centers of the electrostatic chuck 30 and the wafer 40 coincide with each other. In this case, a teaching operation of moving the wafer 40 to adjust the position thereof no longer needs to be performed.

When the differences are not the same, the teaching operation of moving the wafer 40 needs to be performed because the centers of the electrostatic chuck 30 and the wafer 40 do not coincide with each other. In the teaching operation, the wafer 40 is moved using a robot R, after which the second measurement step is performed to check whether the electrostatic chuck 30 and the wafer 40 are concentric with each other. When the electrostatic chuck 30 and the wafer 40 are concentric with each other, the teaching operation is terminated, and when they are not concentric with each other, the moving of the wafer 40 and the second measurement step are repeated.

The second embodiment of the method of teaching the position of the wafer 40 will be described.

The method of teaching the position of the wafer 40 according to this embodiment remains the same as the above-described embodiment in that a first measurement step and a second measurement step are included, the first measurement step and the second measurement step are performed in substantially the same manner as in the above-described embodiment, and three laser distance sensors are used. Thus, a redundant description will be omitted.

The method according to this embodiment is performed by obtaining the coordinates of the centers of the electrostatic chuck 30 and the wafer 40 using measurement results of the first and second measurement steps and then comparing the coordinates.

When the plane on which the electrostatic chuck 30 is placed and the plane on which the wafer 40 is placed are represented by x and y coordinate systems and a specific point (e.g., the center O of the electrostatic chuck 30) is taken as the origin, three coordinates of the edge of the electrostatic chuck 30 on the first straight line l are obtained using the measurement result of the first measurement step, and the coordinates of the center O of the electrostatic chuck 30 are obtained using the three coordinates.

In the same manner, when three coordinates of the edge the wafer 40 on the first straight line l are obtained using the measurement result of the second measurement step, the coordinates of the center of the wafer 40 are obtained using the three coordinates.

To obtain the coordinates of the center of a circle using three coordinates on the circle is a simple geometric method, so a detailed description thereof will be omitted.

When the coordinates of the centers of the electrostatic chuck 30 and the wafer 40 thus obtained are the same, a teaching operation no longer needs to be performed. On the other hand, when the coordinates of the centers of the electrostatic chuck 30 and the wafer 40 are different, a robot R is moved by a robot controller 22 to move the wafer 40 and then the second measurement step is performed to obtain the coordinates of the center of the wafer 40 and compare the same with the coordinates of the center O of the electrostatic chuck 30. This process is repeated until the center O of the electrostatic chuck 30 and the center of the wafer 40 coincide with each other.

Although embodiments of the present disclosure have been described for illustrative purposes, those skilled in the art will appreciate that various modifications, additions, and substitutions are possible, without departing from the scope and spirit of the present disclosure as disclosed in the accompanying claims.

What is claimed is:

1. An apparatus for wafer placement teaching for adjusting a position of a wafer disposed on an electrostatic chuck, the apparatus comprising:
   a laser distance meter disposed above the electrostatic chuck and configured to:
   measure a first distance between two points on an upper surface of the electrostatic chuck, without the wafer present on the upper surface of the electrostatic chuck, using a laser; and
   measure a second distance between two points on an upper surface of the wafer placed on the upper surface of the electrostatic chuck, wherein a diameter of the upper surface of the wafer is greater than a diameter of the upper surface of the electrostatic chuck;
   a controller configured to:
   check a relative position of the electrostatic chuck and the wafer disposed on the electrostatic chuck using the first distance and the second distance measured by the laser distance meter,
   teach the position of the wafer using the checked relative position of the electrostatic chuck and the wafer, so that the wafer is transferred to a predetermined position using a control robot.

2. The apparatus of claim 1,
   wherein the laser distance meter is provided with at least three laser distance meters,
   wherein each of the at least three laser distance meters measures a distance from a first point that is any one point located inside the electrostatic chuck among points on a first straight line that is an imaginary straight line passing through a center of the electrostatic chuck to an edge of the electrostatic chuck located on the first straight line,
   measures a distance from the first point on the first straight line to an edge of the wafer in a state in which the wafer is disposed on the electrostatic chuck,
   calculates a distance difference between the distance from the first point to the edge of the electrostatic chuck and the distance from the first point to the edge of the wafer, and
   compares the distance difference measured by each of the laser distance meters to determine the second position of the wafer.

3. The apparatus of claim 2,
   wherein the distance from the first point on the first straight line to the edge of the electrostatic chuck is obtained by repeatedly measuring a distance from each point on a line segment extending from the first point to a second point, which is a point on the first straight line and is outside the electrostatic chuck, to each of the laser distance meters.

4. The apparatus of claim 2,
   wherein the distance from the first point on the first straight line to the edge of the wafer is obtained by repeatedly measuring a distance from each point on a line segment extending from the first point to a third point, which is a point on the first straight line and is outside the wafer, to each of the laser distance meters.

5. The apparatus of claim 1,
   wherein the laser distance meter is configured in the form of a module in which a plurality of distance meters are combined.

6. The apparatus of claim 4,
   wherein each of the laser distance meters is configured in the form of a module in which a plurality of distance meters are combined.

7. The apparatus of claim 1,
   wherein at least three laser distance meters are installed,
   wherein each of the laser distance meters checks coordinates of an edge of the electrostatic chuck by measuring a distance from a first point that is any one point located inside the electrostatic chuck among points on a first straight line that is an imaginary straight line passing through a center of the electrostatic chuck to the edge of the electrostatic chuck located on the first straight line,
   checks coordinates of an edge of the wafer by measuring a distance from the first point on the first straight line to the edge of the wafer, and
   calculates respective coordinates of centers of the electrostatic chuck and the wafer using the coordinates checked by each of the laser distance meters and then compares the coordinates to determine the second position of the wafer.

8. The apparatus of claim 7, wherein the distance from the first point on the first straight line to the edge of the electrostatic chuck is obtained by repeatedly measuring a distance from each point on a line segment extending from the first point to a second point, which is a point on the first straight line and is outside the electrostatic chuck, to each of the laser distance meters.

9. The apparatus of claim 7, wherein the distance from the first point on the first straight line to the edge of the wafer is obtained by repeatedly measuring a distance from each point on a line segment extending from the first point to a third point, which is a point on the first straight line and is outside the wafer, to each of the laser distance meters.

10. The apparatus of claim 7, wherein each of the laser distance meters is configured in the form of a module in which a plurality of distance meters are combined.

11. A method for wafer placement teaching for adjusting a position of a wafer disposed on an electrostatic chuck, the method comprising:
a first measurement step of measuring a position of the electrostatic chuck using a laser distance meter which measures a first distance between two points on an upper surface of the electrostatic chuck, without the wafer present on the upper surface of the electrostatic chuck, using a laser;
a second measurement step of measuring a second distance between two points on an upper surface of the wafer disposed on the upper surface of the electrostatic chuck using the laser distance sensor, wherein the second measurement step is performed after the first measurement step, and wherein a diameter of the upper surface of the wafer is greater than a diameter of the upper surface of the electrostatic chuck; and
a step of adjusting the position of the wafer using the first distance of the electrostatic chuck measured in the first measurement step and the second distance of the wafer measured in the second measurement step.

12. The method of claim 11, wherein the first measurement step is performed by measuring a distance from a first point that is any one point located inside the electrostatic chuck among points on a first straight line that is an imaginary straight line passing through a center of the electrostatic chuck to an edge of the electrostatic chuck located on the first straight line,
the second measurement step is performed by measuring a distance from the first point on the first straight line to an edge of the wafer in a state in which the wafer is disposed on the electrostatic chuck, and
the position of the wafer is adjusted using a distance difference between the distance from the first point to the edge of the electrostatic chuck and the distance from the first point to the edge of the wafer.

13. The method of claim 12, wherein the first measurement step is performed by repeatedly measuring a distance from each point on a line segment extending from the first point to a second point, which is a point on the first straight line and is outside the electrostatic chuck, to the laser distance meter.

14. The method of claim 12, wherein the second measurement step is performed by repeatedly measuring a distance from each point on a line segment extending from the first point to a third point, which is a point on the first straight line and is outside the wafer, to the laser distance meter.

15. The method of claim 11, wherein the laser distance meter is configured in the form of a module in which a plurality of distance meters are combined.

16. The method of claim 14, wherein the laser distance meter is configured in the form of a module in which a plurality of distance meters are combined.

17. The method of claim 11, wherein at least three laser distance meters are installed,
the first measurement step is performed by measuring a distance from a first point that is any one point located inside the electrostatic chuck among points on a first straight line that is an imaginary straight line passing through a center of the electrostatic chuck to an edge of the electrostatic chuck located on the first straight line,
the second measurement step is performed by measuring a distance from the first point on the first straight line to an edge of the wafer in a state in which the wafer is disposed on the electrostatic chuck, and
the position of the wafer is taught by calculating respective coordinates of centers of the electrostatic chuck and the wafer using the measurement results of the first measurement step and the second measurement step performed by each of the laser distance meters and then comparing the coordinates.

18. The method of claim 17, wherein the first measurement step is performed by repeatedly measuring a distance from each point on a line segment extending from the first point to a second point, which is a point on the first straight line and is outside the electrostatic chuck, to each of the laser distance meters.

19. The method of claim 17, wherein the second measurement step is performed by repeatedly measuring a distance from each point on a line segment extending from the first point to a third point, which is a point on the first straight line and is outside the wafer, to each of the laser distance meters.

20. An apparatus for wafer placement teaching for adjusting a position of a wafer disposed on an electrostatic chuck, the apparatus comprising:
a laser distance meter disposed above the electrostatic chuck and configured to:
measure a first distance between two points on an upper surface of the electrostatic chuck, without the wafer present on the upper surface of the electrostatic chuck, using a laser; and
measure a second distance between two points on an upper surface of the wafer placed on the upper surface of the electrostatic chuck, wherein a diameter of the upper surface of the wafer is greater than a diameter of the upper surface of the electrostatic chuck; and
a controller configured to control a robot configured to transfer the wafer,
wherein the controller checks a relative position of the electrostatic chuck and the wafer disposed on the electrostatic chuck using the first distance and the second distance measured by the laser distance meter so that the wafer is transferred to a predetermined position, and teaches the position of the wafer using the checked relative position of the electrostatic chuck and the wafer, and at least three laser distance meters are installed, wherein each of the laser distance meters measures a distance from a first point that is any one point located inside the electrostatic chuck among points on a first straight line that is an imaginary straight line passing through a center of the electrostatic chuck to an edge of the electrostatic chuck located on the first straight line, measures a distance from the first point on the first straight line to an edge of the wafer in a state in which the wafer is disposed on the electrostatic chuck and then calculates a difference between the distances, and compares the distance difference measured by each of the laser distance meters, or each of the laser distance meters checks coordinates of the edge of the electrostatic chuck by measuring a distance from the first point that is any one point located inside the electrostatic chuck among the points on the first straight line that is the imaginary straight line passing through the center of the electrostatic chuck to the edge of the electrostatic chuck located on the first straight line, checks coordinates of the edge of the wafer by measuring the distance from the first point on the first straight line to the edge of the wafer, and calculates respective coordinates of centers of the electrostatic chuck and the wafer using the coordinates checked by each of the laser distance meters and then compares the coordinates to teach the position of the wafer, and each of the laser distance meters is configured in the form of a module in which a plurality of distance meters are combined.

\* \* \* \* \*